(12) United States Patent
Behle et al.

(10) Patent No.: US 7,810,448 B2
(45) Date of Patent: Oct. 12, 2010

(54) APPARATUS AND METHOD FOR THE TREATING OF WORKPIECES

(75) Inventors: Stephen Behle, Hahnheim (DE); Andreas Lüttringhaus-Henkel, Darmstadt (DE); Gregor Arnold, Bodenheim (DE); Matthias Bicker, Mainz (DE); Jürgen Klein, Mainz (DE)

(73) Assignee: Schott AG, Mainz (DE)

( * ) Notice: Subject to any disclaimer, the term of this patent is extended or adjusted under 35 U.S.C. 154(b) by 1291 days.

(21) Appl. No.: 10/515,514

(22) PCT Filed: May 26, 2003

(86) PCT No.: PCT/EP03/05473
§ 371 (c)(1),
(2), (4) Date: Nov. 25, 2005

(87) PCT Pub. No.: WO03/100120
PCT Pub. Date: Dec. 4, 2003

(65) Prior Publication Data
US 2006/0099340 A1  May 11, 2006

(30) Foreign Application Priority Data

| May 24, 2002 | (DE) | ................. | 102 23 288 |
| Jun. 1, 2002 | (DE) | ................. | 102 24 395 |
| Jun. 7, 2002 | (DE) | ................. | 102 25 607 |
| Jun. 7, 2002 | (DE) | ................. | 102 25 609 |
| Jun. 11, 2002 | (DE) | ................. | 102 25 985 |
| Jun. 20, 2002 | (DE) | ................. | 102 27 637 |
| Jul. 1, 2002 | (DE) | ................. | 102 29 529 |
| Jul. 27, 2002 | (DE) | ................. | 102 34 374 |
| Nov. 16, 2002 | (DE) | ................. | 102 53 512 |
| Nov. 16, 2002 | (DE) | ................. | 102 53 513 |
| Dec. 13, 2002 | (DE) | ................. | 102 58 681 |

(51) Int. Cl.
*C23C 16/00* (2006.01)
*C23F 1/00* (2006.01)
*H01L 21/306* (2006.01)

(52) U.S. Cl. .................. 118/723 R; 118/719; 118/729; 118/730; 156/345.55

(58) Field of Classification Search .................. 118/719, 118/730, 723 R, 729
See application file for complete search history.

(56) References Cited

U.S. PATENT DOCUMENTS 4,369,031 A * 1/1983 Goldman et al. ............ 432/198

(Continued)

FOREIGN PATENT DOCUMENTS

| JP | 8509166 | 10/1996 |
| JP | 2002121667 | 4/2002 |
| WO | WO01/32513 | 5/2001 |
| WO | WO02/10473 | 2/2002 |

OTHER PUBLICATIONS

Office Action dated Jul. 15, 2009 corresponding to Japanese Patent Application No. 2004-507557.

*Primary Examiner*—Parviz Hassanzadeh
*Assistant Examiner*—Rakesh Dhingra
(74) *Attorney, Agent, or Firm*—Ohlandt, Greeley, Ruggiero & Perle, LLP

(57) ABSTRACT

The invention relates to an apparatus and a method for the coating of hollow bodies, in particular for the internal coating of plastic drinks bottles by means of a PICVD. It is an object of the invention to ensure a flexible process sequence, a high throughput, an improved supply of fluid and a high-quality coating. The invention in particular proposes a rotary apparatus which comprises a treatment device with double reactors for receiving in each case at least one workpiece, a fluid supply apparatus and at least one fluid control device, which can be used to control the supply of fluid to the treatment device. It is preferable for the vacuum pumps to be arranged on the rotor such that they rotate therewith.

31 Claims, 9 Drawing Sheets

U.S. PATENT DOCUMENTS

| | | | | |
|---|---|---|---|---|
| 5,252,045 | A | * | 10/1993 | Shinoto et al. ............... 417/524 |
| 5,601,651 | A | * | 2/1997 | Watabe ....................... 118/715 |
| 5,618,388 | A | * | 4/1997 | Seeser et al. ........... 204/192.12 |
| 5,698,260 | A | * | 12/1997 | Roth et al. .................. 427/235 |
| 5,972,436 | A | * | 10/1999 | Walther ...................... 427/535 |
| 6,112,695 | A | * | 9/2000 | Felts ..................... 118/723 E |
| 6,214,119 | B1 | * | 4/2001 | Maher et al. ................. 118/719 |
| 6,818,068 | B1 | * | 11/2004 | Guiffant et al. ............. 118/719 |
| 7,105,204 | B2 | * | 9/2006 | Betteridge ............... 427/427.3 |
| 2001/0042510 | A1 | * | 11/2001 | Plester ................... 118/723 E |
| 2001/0043997 | A1 | * | 11/2001 | Uddin et al. ............... 428/35.7 |
| 2004/0076836 | A1 | | 4/2004 | Beldi et al. |

* cited by examiner

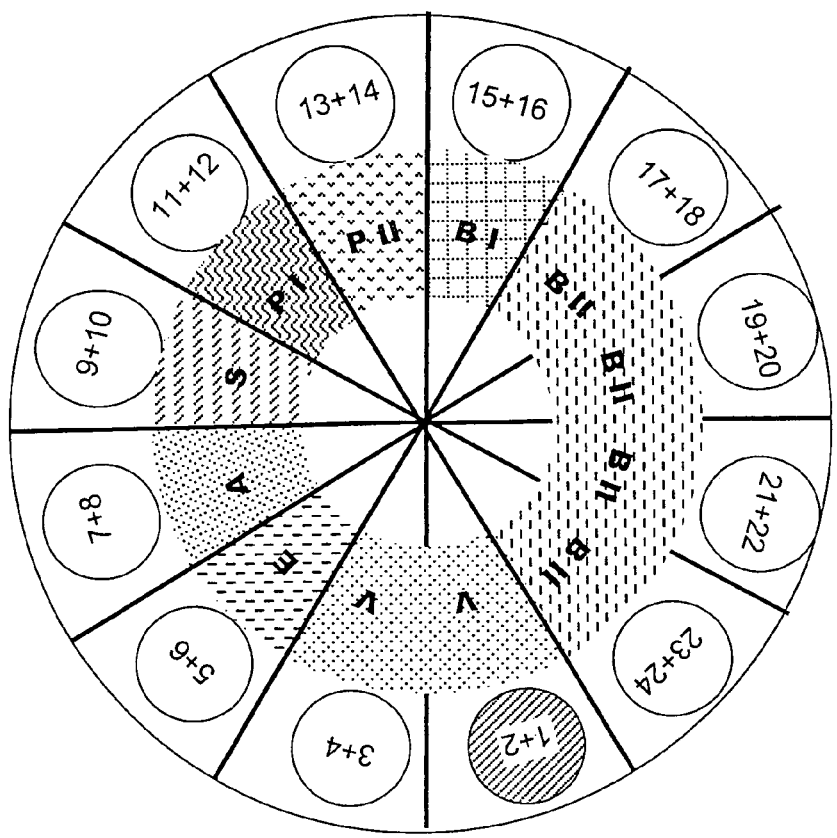
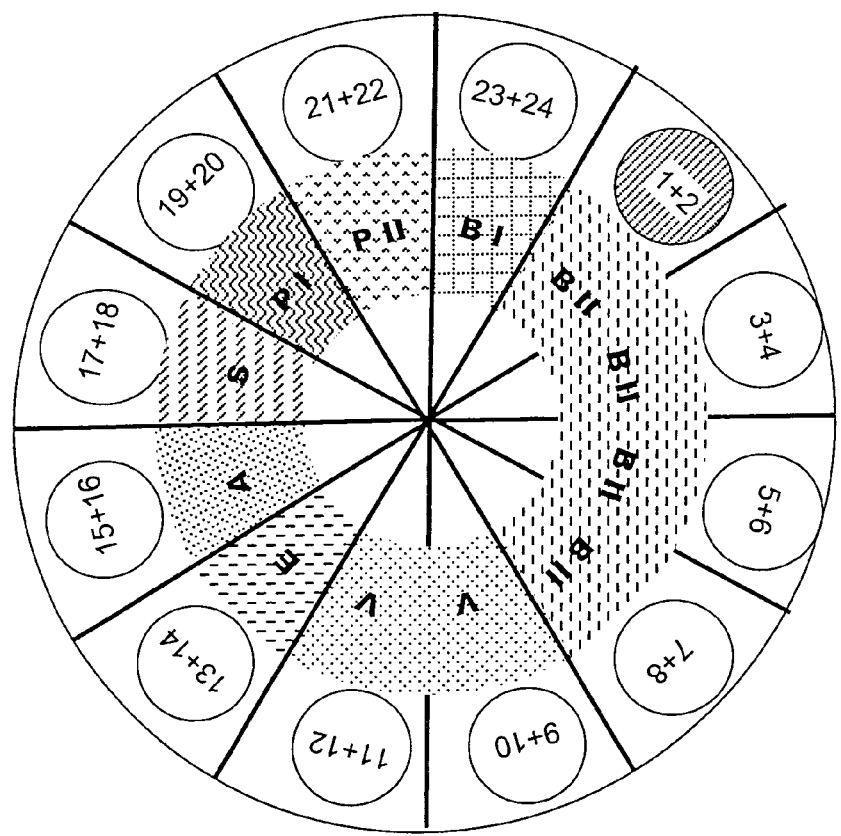
Fig. 1f
Fig. 1e

Fig. 2b

| Winkelposition | 185° | 190° | 195° | 200° | 205° | 210° | 215° | 220° | 225° | 230° | 235° | 240° | 245° | 250° | 255° | 260° | 265° | 270° | 275° | 280° | 285° | 290° | 295° | 300° | 305° | 310° | 315° | 320° | 325° | 330° | 335° | 340° | 345° | 350° | 355° | 360° |
|---|---|---|---|---|---|---|---|---|---|---|---|---|---|---|---|---|---|---|---|---|---|---|---|---|---|---|---|---|---|---|---|---|---|---|---|---|
| Reaktor 1+2 | B II | | | | | | | | | | | | V | | | | | | | | | | | E | | | | | | A | | | | | | |
| Reaktor 3+4 | B II | | | | | | | | | | | | | | | | | | V | | | | | | | | | | | E | | | | | | A |
| Reaktor 5+6 | B II | | | | | | | | | | | | | | | | | | | | | | | | V | | | | | | A | | | | | E |
| Reaktor 7+8 | B I | | | | | | B II | | | | | | | | | | | | | | | | | | | | | | | | V | | | | | |
| Reaktor 9+10 | P II | | | | | | B I | | | | | | B II | | | | | | | | | | | | | | | | | | A | | | | | |
| Reaktor 11+12 | P I | | | | | | P II | | | | | | B I | | | | | | B II | | | | | | | | | | | | | | | | | |
| Reaktor 13+14 | S | | | | | | | | | | | | P I | | | | | | B I | | | | | | B II | | | | | | | | | | | |
| Reaktor 15+16 | A | | | | | | S | | | | | | S | | | | | | P I | | | | | | P II | | | | | | | | | | | |
| Reaktor 17+18 | E | | | | | A | | | | | | A | | | | | | | S | | | | | | P I | | | | | | B I | | | | | |
| Reaktor 19+20 | V | | | | | E | | | | | | E | | | | | | A | | | | | | | P I | | | | | | B II | | | | | |
| Reaktor 21+22 | V | | | | | | | | | | | | | | | | | E | | | | | | | S | | | | | | P I | | | | | |
| Reaktor 23+24 | B II | | | | | | V | | | | | | | | | | | | | | | | | A | | | | | | S | | | | | | |

APPARATUS AND METHOD FOR THE TREATING OF WORKPIECES

BACKGROUND OF THE INVENTION

1. Field of the Invention

The invention relates to an apparatus and a method for the treatment of workpieces with fluids in general and for the coating of hollow bodies in particular.

2. Background of the Invention

Plastics, in particular transparent plastics, are becoming increasingly important and in many sectors are displacing glass as the preferred material.

One example includes drinks bottles, which a few years ago were made almost exclusively from glass but nowadays are already to a large extent being made from PET. The reason for this is the huge weight saving.

However, plastic bottles may also have a number of drawbacks compared to glass bottles, for example the plastics used, such as PET, are insufficiently impervious to gases, and consequently the shelf life is shorter, in particular in the case of carbonated drinks, than with glass bottles unless special measures are implemented.

For this reason, plastic bottles are internally provided with a coating, which leads to an increase in the shelf life.

Since drinks bottles are mass-produced products, there is a huge pressure on cost, and consequently there is an ongoing demand for improvements to the coating methods and the apparatuses used for them.

Accordingly, to efficiently coat PET bottles and other workpieces made from dielectric material, preferably plastics, it is desirable to develop an apparatus and a method which allow very short cycle times and therefore a high throughput. Typical throughputs required are in the region of 10000 bottles per hour.

WO00/58631 has disclosed a machine of this type with a conveyor carousel for the treatment of hollow bodies, in which 20 identical treatment stations are arranged on the conveyor carousel.

The invention defined in the document referred to above is based on the problem that with a large number of treatment stations there is a risk of two adjacent treatment stations being simultaneously connected to the same pressure source.

In the above document, the proposed solution is to provide a machine having a first pumping phase and a second pumping phase as well as a deposition phase in which the stations for the various phases are connected to pumps. Furthermore, it is assumed that the weight and volume of the pumps prevent them from being mounted on the carousel. Therefore, the pumps are in a fixed position and a rotating connection or distributor is used to connect the pumps to the stations.

Furthermore, the 20 stations are divided into two groups, each group being assigned to an independent and equivalent pressure source, or the groups being differentiated on the basis of which pumps they are connected to. The rotating distributor determines the instants during the rotary movement of the conveyor carousel at which a certain pump is connected to a certain treatment station, the distributor for this purpose having a rotating ring comprising 20 openings and a fixed ring comprising in each case 3 slots for the two groups. To benefit from this arrangement, the machine is designed in such a way that two stations of the same group are not simultaneously connected to the corresponding pump.

Accordingly, the invention described defines as its subject matter a machine which is able to include a large number of stations and at the same time to ensure that a pressure source at a defined instant is only connected to at most one treatment station.

However, this machine has a number of serious drawbacks.

Firstly, the parallel connection of a plurality of pumps is disadvantageous, since multiple tube routing is required.

Furthermore, the stationary arrangement of the pumps is disadvantageous, since the paths from the stations to the pump are relatively long and therefore the pump power is reduced.

However, the use of the rotatable distributor is particularly disadvantageous. Distributors of this type are extremely difficult to seal and are susceptible to faults caused by foreign bodies. Furthermore, on account of the fixedly predetermined opening arrangement, the distributor does not allow any variation to the process sequence and therefore this represents an inflexible design.

However, it is not only the method which takes place on the abovementioned apparatus but also the coating of amorphous carbon used which is in need of improvement, since this coating is undesirably colored. Furthermore, there is a risk of the layer of carbon flaking off in the event of deformation to the bottle.

SUMMARY OF THE INVENTION

Therefore, the invention is based on the object of providing an apparatus and a method for the treatment of workpieces which avoid or at least alleviate the drawbacks of known apparatuses and methods.

A further object of the invention is to provide an apparatus and a method for the treatment of workpieces which operate reliably and ensure a high throughput.

Yet another object of the invention is to provide an apparatus and a method for the treatment of workpieces which can be flexibly matched to the requirements of the user or of the desired process sequence.

Yet another object of the invention is to provide an apparatus and a method for the treatment of workpieces which ensures an improved supply of fluid, in particular allowing operation with few interruptions.

Yet another object of the invention is to provide an apparatus and a method for the treatment of workpieces which make it possible to achieve an improved coating, in particular in terms of coloration and bonding.

The object of the invention is achieved in a surprisingly simple way by the subject matter of the independent claims. Advantageous refinements of the invention are defined in the subclaims.

A preferred embodiment of the invention provides an apparatus for the treatment of workpieces, in particular for the internal coating of hollow bodies. Workpieces to be coated are in particular plastic containers, e.g. drinks bottles.

The apparatus according to the invention comprises at least one treatment device, preferably a plurality of identical treatment devices, which are each designed to receive at least one workpiece or a plastic bottle, and a fluid supply apparatus, which supplies the treatment device with at least one process fluid for the coating.

Furthermore, the apparatus comprises at least one fluid control device, in particular a first valve arrangement having a plurality of valves, the supply of fluid to the treatment devices being controllable by means of the first valve arrangement, in particular by means of the valves.

The control of the fluid or gas supply can advantageously be programmed extremely flexibly and variably by means of the first valve arrangement. Consequently, the time control or the process sequence defined by the apparatus can be altered and can easily be matched to differing requirements. Furthermore, the invention allows short switching times and therefore a rapid change to the process parameters.

Furthermore, the apparatus according to the invention operates reliably and with a high throughput.

In addition the invention allows an efficient treatment or coating, which is therefore inexpensive in the long term, of the workpieces with an excellent quality.

It is preferable to provide a plurality of, in particular identical, treatment devices and for the first valve arrangement to comprise a plurality of, in particular identical, valve groups, each treatment device being assigned a separate valve group. It is preferable for the valve groups each to comprise a plurality of if appropriate identical valves.

As a result, each treatment device or its fluid supply can advantageously be actuated independently of the other treatment devices by means of its associated valve group.

According to a preferred refinement of the apparatus according to the invention, the apparatus defines a plurality of, in particular different, process phases, which are each passed through by the treatment devices. More specifically, each treatment device successively passes through all the process phases, so that in particular at least two or all of the treatment devices are in different process phases at at least one or each instant.

Each process phase is assigned a predetermined state of the first valve arrangement, it being possible for the state to be set variably for each phase by a formula. The term formula is to be understood as meaning an, in particular predetermined, sequence of the process effected by means of the control unit. A higher flexibility is advantageously achieved by parameters which can be set freely, for example switching times, switching angles and/or switching durations, etc.

It is preferable for the formula, the assignment to the process phases and/or the duration of the process phases to be set differently for different workpieces, e.g. different bottle volumes and geometries, making the invention even more flexible.

In particular, each process phase is time-correlated with a predetermined state of the valve group permanently assigned to the respective treatment device. In other words, the process phases of each treatment device are controlled by means of the associated valve group, or the prevailing process phase of each treatment device is defined by the state of the associated valve group.

This further improves the accuracy, speed and flexibility of the apparatus.

It is preferable for the first valve arrangement, in particular each valve group or the valves, to be controllable, preferably independently of one another, by means of control signals. The valve arrangement or the valve block or the valves are controlled in particular electrically, pneumatically and/or hydraulically, etc., which has a beneficial effect on the control times and therefore on the process speed.

According to a preferred embodiment of the invention, the apparatus defines at least two or more process phases, the workpiece being coated with a first and a second coating during at least a first and a second process or coating phase, respectively. The first and second coatings in particular comprise different materials.

It is preferable for at least in each case one diaphragm with a predetermined opening, preferably of identical size, to be assigned to at least one of the treatment devices, in particular each treatment device, in order to reduce the pressure in the fluid feed. In this context, the diaphragm defines a predetermined through-flow quantity for a defined admission pressure. This represents an extremely simple and inexpensive way of reducing the pressure.

According to an advantageous and therefore preferred refinement of the invention, the apparatus comprises a fluid distributor device, by means of which the fluid is distributed to the treatment devices, and/or a flow-quantity setting means, e.g. a mass flow controller, which is arranged upstream of the fluid distributor device, as seen in the fluid direction of flow. Therefore, the fluid or gas flow rate can be set centrally for all the treatment devices.

This is advantageous from a cost aspect, since despite the large number of reactors the gas flow through each individual reactor does not have to be set by in each case a separate mass flow controller or molecular flow controller, but rather a mass flow controller is simply provided for each process gas.

Nevertheless, the invention allows a rapid change to at least one of the following process parameters:
composition of the process fluid or a precursor,
precursor concentration,
total gas flow rate, and
pressure in the treatment devices.

Furthermore, a change in at least one or more process parameters in the treatment devices can be set independently of one another and/or at an instant in time which can be selected as desired.

It is preferable for the fluid supply apparatus to make available a plurality of different fluids, in particular process gases, in which case in particular each valve group has a separate valve for each fluid and/or a separate diaphragm for each treatment device. This means in particular that the different fluids are fed to the treatment devices in separate feed lines and the flows of fluid can be controlled independently of one another.

Two-layer or multilayer systems are advantageous for the coating of plastics in order to satisfy the demands imposed on layer-substrate bonding. By way of example, a first, organic bonding layer is deposited, and then, in one or more further steps, further functional layers, in particular a barrier layer, are applied, these layers differing with regard to at least one physical or chemical property, such as for example the composition, density, roughness, morphology, growth mode, reflection/transmission, barrier action.

The bonding layer increases the bonding and prevents or at least impedes undesirable flaking of the layers. Furthermore, the combination of the two layers has a synergistic effect whereby the bonding layer also boosts the barrier action.

A two-component or multicomponent coating as provided by the invention is highly advantageous in particular for workpieces in the form of plastic drinks bottles since it is possible to lengthen the shelf life of the drink and, at the same time, undesirable introduction of the layer material into the drink is avoided.

For rapid coating of plastic containers, when using a CVD process, in particular PECVD, preferably PICVD, it is advantageous to use a gas generation method using the fluid supply apparatus and a coating method which provides at least two different gases or gas mixtures.

In one particularly advantageous embodiment of the invention, at least one, or even more preferably each, of the treatment devices comprises at least two or more treatment stations or reactors, which are each designed to receive a workpiece and in particular are parallel and symmetrical in structure and therefore are simultaneously connected to the process stages, with identical process parameters being established in the treatment stations. In other words, the treatment stations and therefore the workpieces which they hold in a defined treatment device pass through the process phases in such a manner that the respective treatment stations are in the same process phase at least at one instant, in particular at each instant.

Preferably, therefore, the treatment stations are divided into two or more groups, each group being assigned in particular to precisely one treatment device, and the treatment stations being switched identically, in such a manner that at least the evacuation of the treatment stations belonging to the same group or treatment device is synchronized, with the result that at least two treatment stations, in particular the treatment stations belonging to the same group, at least from time to time are simultaneously connected to the same pump.

The treatment stations of a respective treatment device are in this case assigned to the same valve group. A number of two or a multiple of two, in particular four, six, eight or more, treatment stations or reactors per treatment device has proven particularly appropriate.

Connecting up a plurality of treatment stations which are switched identically in a treatment device allows the apparatus throughput to be increased considerably with little extra outlay.

In this case, the process gases are in particular distributed uniformly to a plurality or all of the reactors, preferably from 10 to 100 of them. It is preferable for the individual reactors either in each case to have a separate gas feed or for the reactor groups, e.g. double reactors, to be supplied with the process gases jointly.

It is preferable for the apparatus to define a treatment cycle with a plurality of process phases, the treatment cycle being passed through by at least one or each treatment device in a manner which is offset in terms of time with respect to the other treatment devices. Likewise, at least one or each valve group passes through a predetermined cycle of states, with each process phase of a particular treatment device being correlated with a defined but controllable state of the associated valve group.

It is preferable for each treatment device to pass through the identical treatment cycle in particular at least with regard to sequence, time, duration and/or interval between the phases.

The apparatus according to the invention is in particular a once-through or rotary installation and comprises a static portion and a moveable portion or rotor. The treatment devices are preferably arranged at the moveable portion or the rotor and move or rotate with the latter. In this case, each treatment device adopts a plurality of positions or angular positions during the treatment cycle, each position being correlated with a predetermined process phase. In other words, the process phases are synchronized with the positions or angular positions, and this synchronization is also controllable. For this purpose, it is preferable for the valve groups to be controlled synchronously with the angular position of the rotor.

It is particularly preferable for the first valve arrangement to be arranged at the moveable portion or rotor so as to move or rotate with it. This allows simple fluid routing.

An exemplary embodiment of the invention in which a pump device is provided for evacuating the treatment devices at least from time to time using at least one pump, e.g. a Roots pump, is particularly advantageous.

Consequently, the pump device can be connected to the treatment devices fixedly or without rotating distributor, and the phased evacuation of the treatment devices, more specifically the start and/or end of the evacuation phases, is controlled, if appropriate using closed-loop control, by means of an evacuation control device. This is highly advantageous in particular in the case of the rotary installation.

The evacuation control device controls the assignment of the treatment devices to the pump device and preferably comprises a second valve arrangement, so that the evacuation is controlled via valves. It is preferable for the second or pump-side valve arrangement also to be divided into valve groups, in such a manner that each treatment device is assigned a valve group, with in particular in each case one valve of the valve groups being assigned to a feed device or vacuum pump in order to achieve independent control of the assignment of the individual vacuum pumps. The valves are preferably of the same type as the valves of the first valve arrangement, i.e. the valve arrangement on the fluid feed side.

The treatment devices are evacuated, preferably cyclically, by means of the pump device, and control by means of the evacuation control device is effected by means of, for example, changeable control signals. Therefore, the evacuation and/or the fluid feed can be controlled preferably variably and/or individually with respect to the particular treatment devices.

It is preferable for the pump device to comprise at least two pumps which are assigned to different pressure ranges and effect cascaded or stepped evacuation. In particular, each treatment device is first of all connected to a first pump and evacuated to a first pressure, before then being disconnected from the first pump and connected to a second pump and evacuated by the second pump to a second, lower pressure.

According to a preferred embodiment, each treatment device passes through a plurality of different process phases during rotation of the rotor, the pump device comprising at least a first and a second pump stage, which are assigned to different pressure ranges, and the corresponding treatment device being successively evacuated in steps by means of the first and the second pump stage. Furthermore, at least a third and/or a fourth of the process phases is in each case a coating phase, during which the corresponding treatment device is evacuated by means of the pump device, in particular by means of a third or fourth pump stage, while at the same time a process gas is being supplied for plasma coating.

It is particularly advantageous if the first and the second pump stage in each case comprise just one first or second vacuum pump, respectively, so that all the treatment devices in their first pumping phase are connected to the first vacuum pump and evacuated and in their second pumping phase are connected to the second vacuum pump and evacuated.

This advantageously enables the number of expensive vacuum pumps, for example large-volume Roots pumps, to be minimized.

Furthermore, it is preferable for the pump device to be arranged at or secured to the rotor so as to rotate therewith.

At first glance, it may appear disadvantageous for the heavy pumps to be secured to the rotor. However, in particular the combination with a reduced number of vacuum pumps, on account of the relatively low weight loading, surprisingly and synergistically reverses this apparent drawback even to the extent that it becomes an advantage, since it is in this way possible to dispense with a rotating sealing connection or a pump-side rotary slide leadthrough which places the treatment devices in communication with the pump device, as connections of this type are difficult to seal.

Furthermore, it is preferable for the first and the second treatment station of the respective treatment device to be simultaneously connected to the pump stage belonging to the respective process or pumping phase and evacuated. This is because the inventors have discovered that it is advantageous for a plurality of treatment stations or positions to be evacuated simultaneously using the same pump, since in this way the process sequence can be improved and an increased throughput can be achieved.

It is preferable for parameter changes with regard to the treatment devices to take place at different instants and/or, with regard to the treatment stations of a specific treatment device, simultaneously. The parameter changes are in particular switched cyclically with respect to the rotation of the rotor or at equal time intervals.

Furthermore, different process parameters are set simultaneously in at least two reactors. Furthermore, in substantially each rotor position, there is in each case at least one treatment device in the first and the second coating phase, so that at each instant the coating devices are divided into a first process group and a second process group having first and second parameter settings. It is preferable for the number of reactors with the first parameter setting to be less than or equal to the number of reactors with the second parameter setting, for the second coating phase to last as long as or longer than the first.

This concept is particularly advantageous for rotary apparatuses but may also be used for batch installations, in which individual reactor groups are supplied with process gas with a time delay. The advantage for batch installations is that a lower total gas flow rate is required for the apparatus as a whole, and therefore the suction capacity for the vacuum pumps is also lower than if the gases are introduced simultaneously into all the treatment devices or if a completely identically connected method is used.

Furthermore, it is preferable for the two successive coating phases to differ with regard to at least one of the following parameters:
 different concentrations of the process fluid,
 different pressures of the process fluid,
 different quantitative flow of the process fluid,
 different precursors for the coatings.

It is particularly advantageous for the pumping phase for the first and the second treatment station of a treatment device to be started and ended simultaneously, since this also makes a contribution to improving the process economics.

Unlike the pump device, the fluid supply apparatus is preferably arranged at the static portion of the apparatus, so that it is advantageously possible to change fluid storage vessels or cylinders without having to stop the rotor.

It is preferable for the fluid supply apparatus to comprise at least two fluid storage devices containing different fluid base materials for producing the at least two coatings, so that the first and the second layer can be applied using the first and the second fluid, respectively, during two different process or coating phases. The workpieces are in this case coated by means of chemical vapor deposition (CVD), in particular plasma-enhanced CVD (PECVD) or CVD with pulsed plasma (plasma impulse CVD, PICVD).

It is preferable for the fluid to be fed to the treatment devices via a rotatable, sealing connection in the fluid feed, by means of which the fluid supply apparatus is connected to the treatment devices, if appropriate indirectly with further devices, in particular the first valve arrangement, connected in between, it being possible, in particular when the apparatus is operating, for the fluid to be removed continuously for the treatment devices at the outlet of the connection.

With regard to the fluid direction of flow, the flow-quantity setting means are arranged downstream of the fluid storage device, and a separate mixing device for each fluid storage device is arranged downstream of the fluid-quantity setting means for the purpose of mixing the fluid from the fluid storage device with in each case at least one further fluid, the connection is arranged downstream of the mixing device, the fluid distributor device is arranged downstream of the connection, the diaphragms are arranged downstream of the fluid distributor device and/or the valve groups are in each case arranged downstream of the associated diaphragms. It is preferable for the diaphragms and/or valves to be located close to the corresponding reactor, e.g. at a distance of <50 cm, <30 cm or <15 cm, and/or to be arranged at the rotor.

The sequence of the method according to a preferred embodiment is as follows, with each treatment device, or its treatment stations, passing through a treatment cycle which comprises at least the following process phases, preferably in this order:
 mounting workpieces in and closing the treatment device,
 evacuating the treatment device to a first pressure using a first pump stage,
 evacuating the treatment device to a second pressure, which is lower than the first pressure, using a second pump stage,
 coating the workpiece in the treatment device with a first coating material,
 coating the workpiece in the treatment device with a second coating material,
 venting the treatment device,
 opening the treatment device and removing the workpiece.

The following text provides a more detailed explanation of advantageous embodiments of the fluid supply to the apparatus.

According to a preferred refinement of the invention, the apparatus comprises a fluid supply apparatus, which comprises a first fluid storage device for a first fluid base material, a fluid feed for a first mixing fluid, a mixing device used to mix the first fluid base material and the first mixing fluid, a fluidtight first line that connects the first fluid storage device to the mixing device, a fluidtight second line that connects the fluid feed for the first mixing fluid to the mixing device, and a first flow-quantity setting means in the first line, in particular upstream of the mixing device, which can be used to set the quantitative flow of the first fluid base material.

It is particularly preferable for the first fluid base material in the first fluid storage device to be liquid. In this case, the first line is heated in order to evaporate the first fluid base material, so that the first fluid base material and the first mixing fluid, both in the gaseous state, can be mixed at the mixing device. In this way, a process fluid which is gaseous at room temperature is provided at the outlet of the mixing device.

It is preferable for the fluid supply apparatus also to have a second flow-quantity setting means, which is arranged in the second line, in particular upstream of the mixing device, and is used to set the quantitative flow of the first mixing fluid.

It is preferable for the fluid supply apparatus also to comprise a second fluid supply device which is constructed in the same way as the first fluid supply device, the first and second fluid supply devices containing different fluid base materials. As a result, for example for coating with two different materials, two different process gases are provided for the treatment devices simultaneously via two separate lines.

The process gases are preferably mixtures of firstly a metal-containing or silicon-containing and/or hydrocarbon-containing fluid and secondly at least one further fluid which contains oxygen, nitrogen, argon and/or helium. An $HMDSO/O_2$ mixture from the first fluid supply device and an $HMDSN/O_2$ mixture from the second fluid supply device are particularly preferred.

Furthermore, it is preferable for the first and/or second fluid storage device each to comprise two redundant vessels containing the same fluid base material. This even allows the storage vessels to be exchanged without stopping operation of the apparatus, thereby avoiding a production shutdown. The redundant vessels are connected to one another in particular upstream of the first flow-quantity setting means and can be disconnected from the latter by means of in each case one valve.

It is preferable for the apparatus also to comprise a purge device for purging the treatment devices or reactors with a purge gas, preferably oxygen, nitrogen and/or dried air. Purging is preferably carried out after application of the second layer, before or after and/or during venting. In this way, unused gas is advantageously removed, so that it is possible to avoid or reduce the extent of undesired reactions with the atmospheric humidity. Furthermore, in this way the absorption of the process gases at a surface of the workpiece is avoided. In a preferred embodiment, the purging of all the treatment devices is carried out at different instants, preferably cyclically and/or at regular intervals.

In the text which follows, the invention is explained in more detail on the basis of exemplary embodiments and with reference to the drawings, in which identical and similar components are provided with identical reference numerals and the features of various embodiments can be combined with one another.

BRIEF DESCRIPTION OF THE FIGURES

In the drawing:

FIGS. 1a-1h diagrammatically depict a first embodiment of the apparatus according to the invention in various rotor positions in accordance with an example of a process sequence, FIGS. 2a-2b show a summary in table form of the process sequence carried out by the apparatus illustrated in FIGS. 1a-1h, FIG. 3 diagrammatically depicts the apparatus shown in FIGS. 1a-1h.

DETAILED DESCRIPTION OF THE INVENTION

Figure 1B:
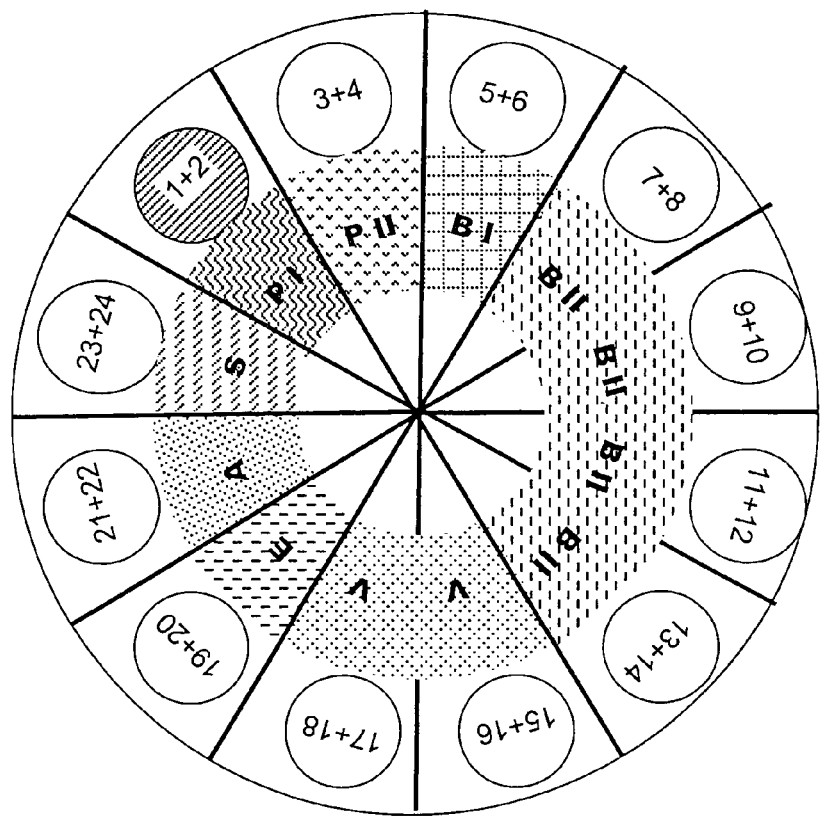
Figure 1A:
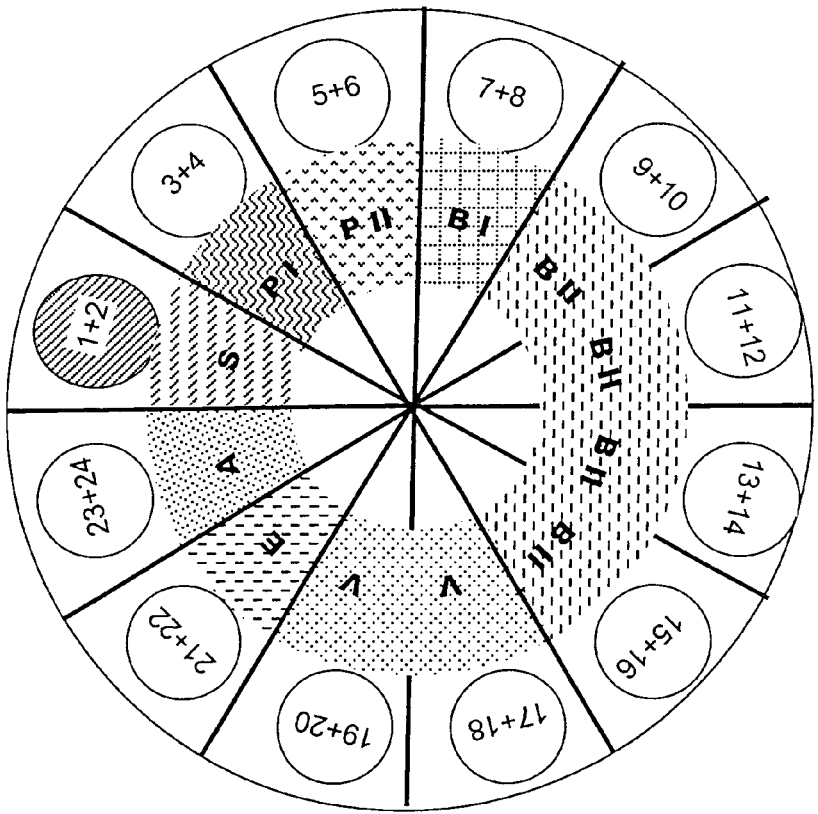
Figure 1C:
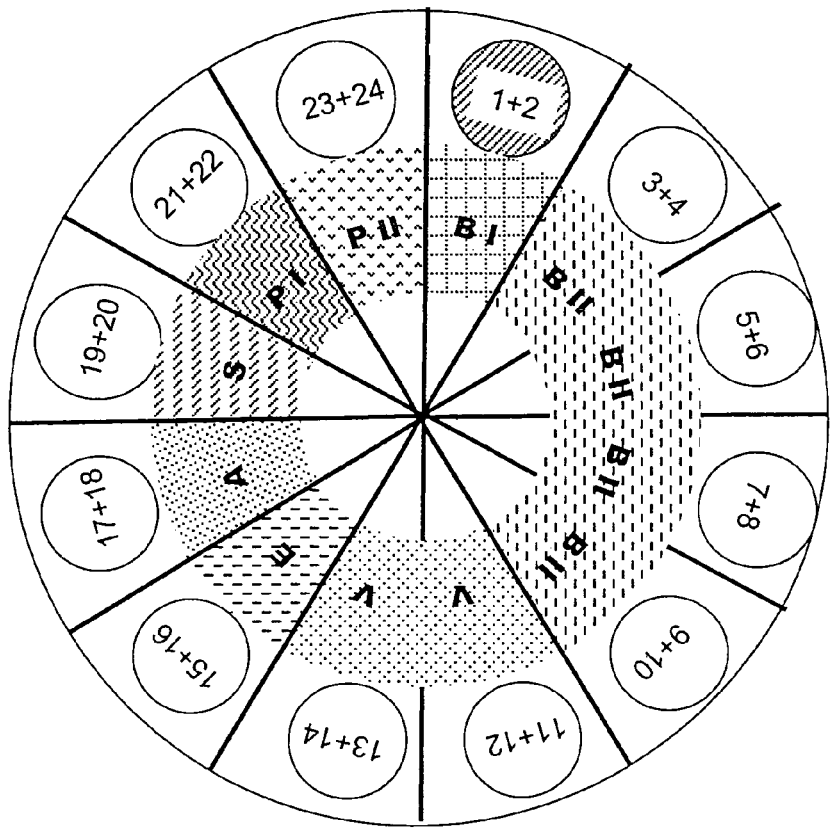
Figure 1D:
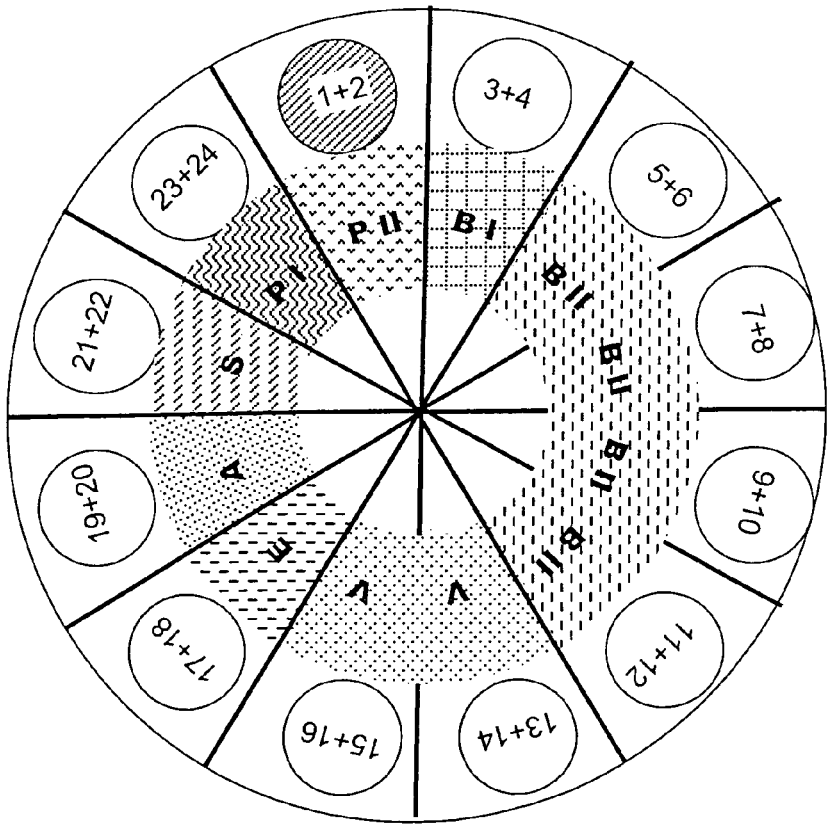
Figure 1H:
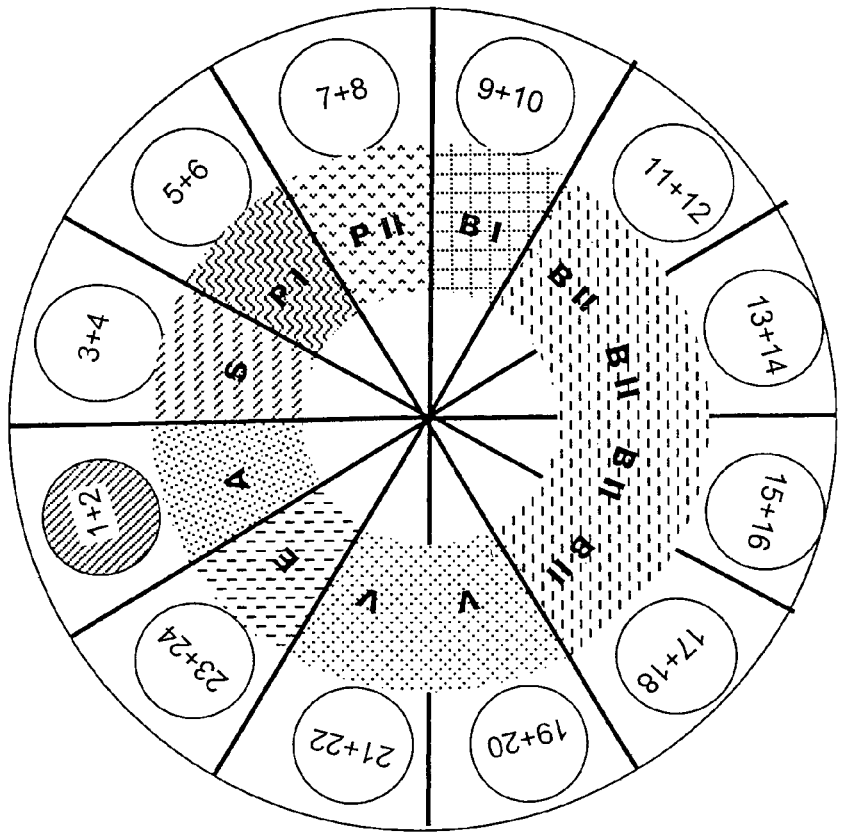
Figure 1G:
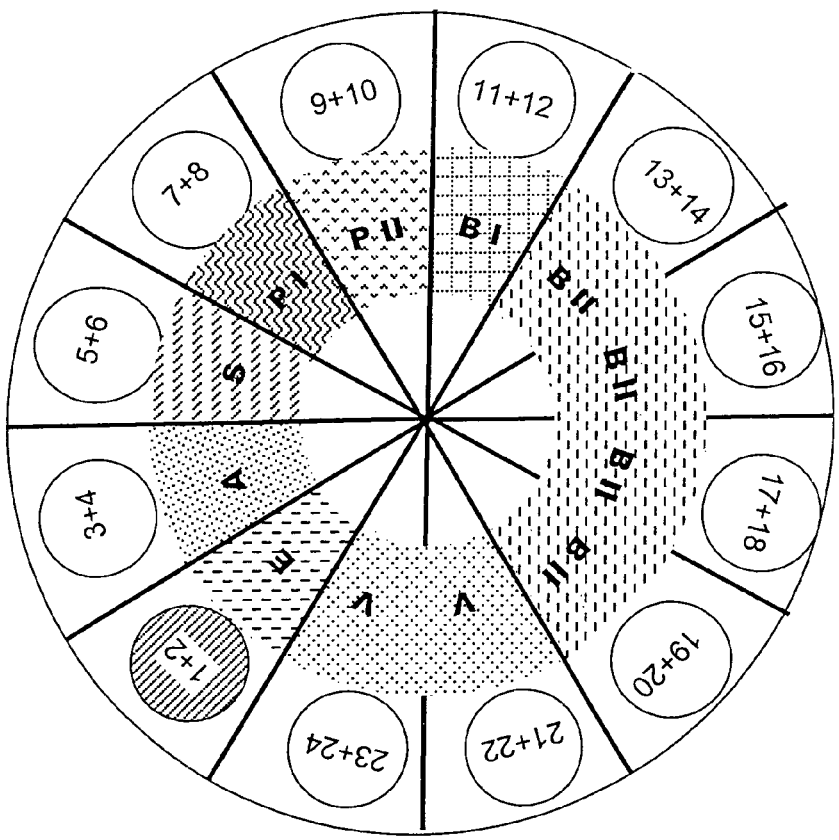

FIG. 1a diagrammatically depicts a rotor 32 of an apparatus 30 according to the invention.

On the rotor 32 there are twelve treatment devices, represented by the circles. Each treatment device comprises two treatment stations or reactors, which are numbered consecutively from 1 to 24. The treatment devices are distributed uniformly, i.e. are arranged at angular intervals of 30°.

Furthermore, eight process phases are illustrated, namely:
a starting phase S,
a first pumping phase PI,
a second pumping phase PII,
a first coating phase BI,
a second coating phase BII,
a vent phase V,
an end phase E, and
an auxiliary phase A.

FIG. 1a shows a time state in which the treatment stations 1 and 2 are in the starting phase S. This also predetermines the respective process phases or process steps of the other treatment devices or treatment stations. The treatment stations 3 and 4 are in the first pumping phase PI, the treatment stations 5 and 6 are in the second pumping phase PII, the treatment stations 7 and 8 are in the first coating phase BI, the treatment stations 9 to 16 are in the second coating phase BII, the treatment stations 17 to 20 are in the vent phase V, the treatment stations 21 and 22 are in the end phase E, and the treatment stations 23 and 24 are in the auxiliary phase A.

In operation, the rotor rotates, so that each treatment device passes through the entire cycle of the stationary process phases. FIG. 1b shows the rotor in a state which is 30° later than that shown in FIG. 1a. Accordingly, the treatment stations 1 and 2 are now in the first pumping phase PI. FIGS. 1c to 1h each illustrate a state in which the rotor has been rotated further, with the reactors 1 and 2 in each case being in a further process phase. Therefore, FIGS. 1a to 1h show a complete treatment cycle, although the states in which the process phase of the reactors 1 and 2 does not change are not illustrated.

The following text provides an explanation of the individual process phases with reference to FIG. 1a. In this state of the rotor, the treatment device comprising the reactors 1 and 2 is in the starting phase S, in which the treatment device is open. Furthermore, in an insertion operation the two reactors 1 and 2 simultaneously and identically have in each case one PET bottle mounted in them and are then closed again.

In the first pumping phase PI, the two reactors 3 and 4 are simultaneously connected to a first pump stage in order to be evacuated down to the first pressure. In the second pumping phase PII, the two reactors 5 and 6 are simultaneously connected to a second pump stage in order to be evacuated down to a lower, second pressure. Therefore, the treatment devices are evacuated in steps, and therefore highly effectively, by means of the first and second pump stages.

In the first coating phase BI, the two PET bottles in the reactors 7 and 8 are coated with a first coating, more specifically an $SiO_xC_y$ bonding layer, from the inside.

For this purpose, a mixture of hexamethyldisiloxane (HMDSO) and oxygen is used as process gas. This mixture is introduced into the two reactors 7 and 8 simultaneously. In the first coating phase BI, the reactors 7 and 8 are supplied with a first process gas and evacuated in through-flow mode using a third vacuum pump.

The second coating phase BII takes up four 30° sectors of the treatment cycle, since the coating should last four times as long as the first coating phase BI. Accordingly, there are four treatment devices or plasma stations, more specifically reactors 9 to 16, in the second coating phase BII simultaneously, and in this second coating phase they are supplied with a second process gas and are jointly evacuated in through-flow mode by a fourth vacuum pump. Therefore, in particular at each instant, there is a different number of treatment devices in the first and second coating phases.

In the second coating phase BII, a vitreous silicon oxide or $SiO_x$ barrier layer is deposited. This layer is colorless and transparent. To produce the barrier layer, a mixed gas comprising hexamethyldisilazane (HMDSN) and oxygen is introduced into the reactors.

With regard to the layer composition, reference is made to application DE 102 58 681.0, filed on Dec. 13, 2002 in the name of the same Applicant, the content of which is hereby incorporated in full by reference in the subject matter of the present disclosure.

The coating in the first and the second coating phases BI, BII is carried out by means of PICVD. In this exemplary embodiment, the PICVD process is used only for internal coating of the bottles, but it may also be used for external coating. One major advantage of the PICVD process is an additional process flexibility, allowing the barrier layer to be matched even more deliberately to the customer requirements. Furthermore, pulsation of the plasma results in optimum conversion of the process gas used, since gaseous byproducts formed during the reaction are effectively pumped out during pauses between the pulses. Furthermore, the layers which are deposited are distinguished by a high degree of homogeneity and a high chemical purity. In addition, the thermal loading on the PET bottles is reduced.

At the same time, the double coating produces excellent bonding of the coating system and a high barrier improvement factor (BIF). A BIF of approximately 10 to 30 is achieved for $O_2$ and of approximately 4 to 7 for $CO_2$. In addition to $CO_2$ being prevented from escaping from the bottle, it is also possible to reduce the extent to which $O_2$ penetrates into the bottle and to which acetaldehyde escapes from the PET into the drink.

During the vent phase V, the reactors 17 to 20 are vented. Then, the reactors 21 and 22 are opened in the end phase E and the coated bottles are removed.

The auxiliary phase A, in which reactors 23 and 24 are located, is not required for the coating process in this embodiment.

Figure 2A:
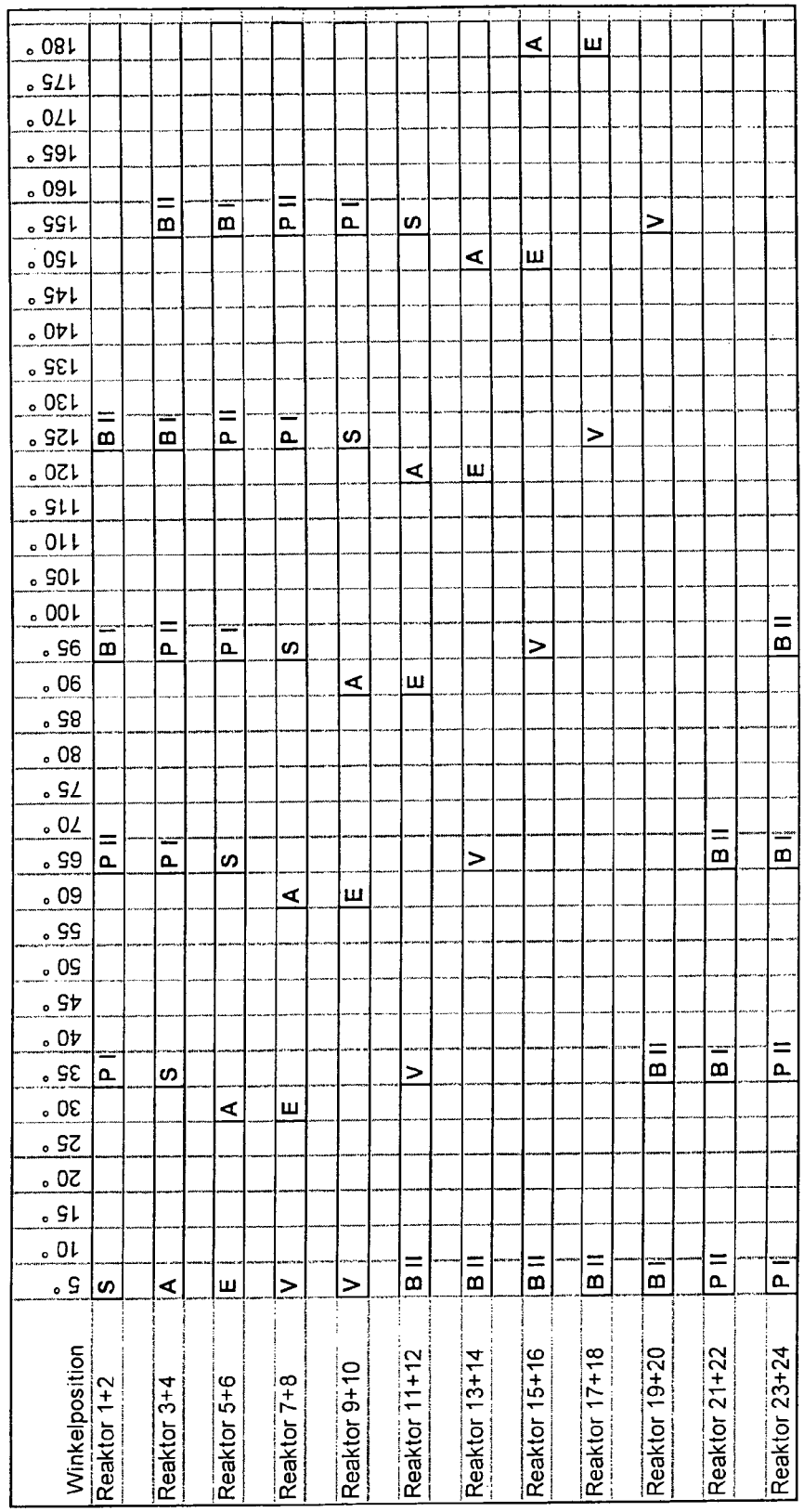

FIGS. 2a to 2b show a summary in table form, divided into 5° angle steps, of the sequence of the process phases S, PI, PII, BI, BII, V and A for all 24 reactors.

Figure 3:
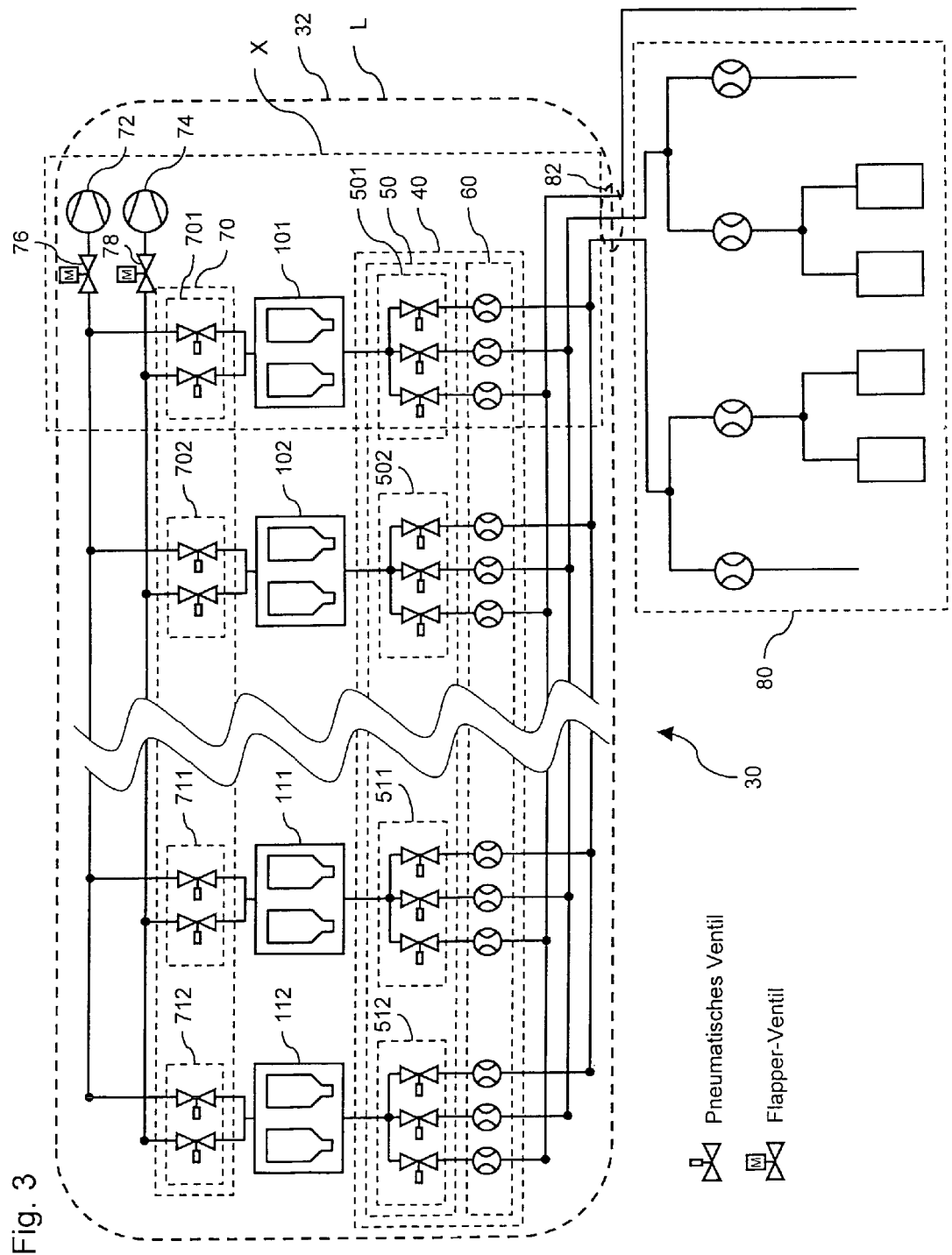

FIG. 3 then diagrammatically depicts the structure of the apparatus 30 according to the invention.

The coating apparatus 30 comprises the rotor 32 and a stationary fluid supply apparatus 80. The dashed line L diagrammatically represents the rotor or the plasma wheel 32, so that those components which are illustrated inside the line L are arranged at or on the rotor 32 and rotate therewith.

Twelve treatment devices 101 to 112 are arranged on the rotor 32, although only the four treatment devices 101, 102, 111, 112 are illustrated in FIG. 3, for the sake of clarity.

Each treatment device 101 to 112 comprises in each case two treatment stations or reactors for receiving in each case one PET bottle which is to be coated. The treatment device 101 comprises the treatment stations 1 and 2, the treatment device 102 comprises the treatment stations 3 and 4, etc., up until the treatment device 112, which comprises the treatment stations 23 and 24.

The internal coating of the PET bottles is carried out by means of the PICVD technique, with which the person skilled in the art will be thoroughly familiar. In this process, the in each case two reactors of a treatment device are assigned the same radio-frequency source, and the coating in the two reactors takes place simultaneously and identically, with the in each case two reactors comprising separate chambers or vacuum chambers.

Preferably, therefore, the in each case first reactors 1, 3, 5, ..., 23 of the treatment devices 101 to 112 form a first group of treatment stations, and the in each case second reactors 2, 4, 6, ..., 24 of the treatment devices 101 to 112 form a second group of treatment stations, with in each case one reactor belonging to the first group and one reactor belonging to the second group being associated with one another in pairs (1 and 2; 3 and 4; 5 and 6; ...; 23 and 24) and the two reactors of each pair being assigned to the same vacuum pumps and/or passing synchronously through the treatment process.

The treatment devices 101 to 112 are assigned a fluidtight liquid or gas control device 40, which in this example comprises a multiplicity of valves and diaphragms.

The supply of gas to the treatment devices is time-controlled by means of the gas control device 40. The gas control device 40 comprises a first valve arrangement 50 having in each case one valve group 501 to 512 for each treatment device 101 to 112. The parallel-connected valve groups 501 to 512 comprise in each case three electrically controlled valves 501a to 512a, 501b to 512b and 512a to 512c, which each have a fixed diaphragm connected upstream of them. Therefore, the distribution or allocation of the process gases to the treatment devices is effected via the valves 501a/b to 512a/b.

In principle, however, it is also possible to use a rotating rotary leadthrough or rotary coupling, in which in particular passages which realize the cyclical gas changes are provided, instead of the valve arrangement 40. However, control by means of valves is more flexible and consequently the treatment devices can even be actuated separately and/or differently.

Figure 4:
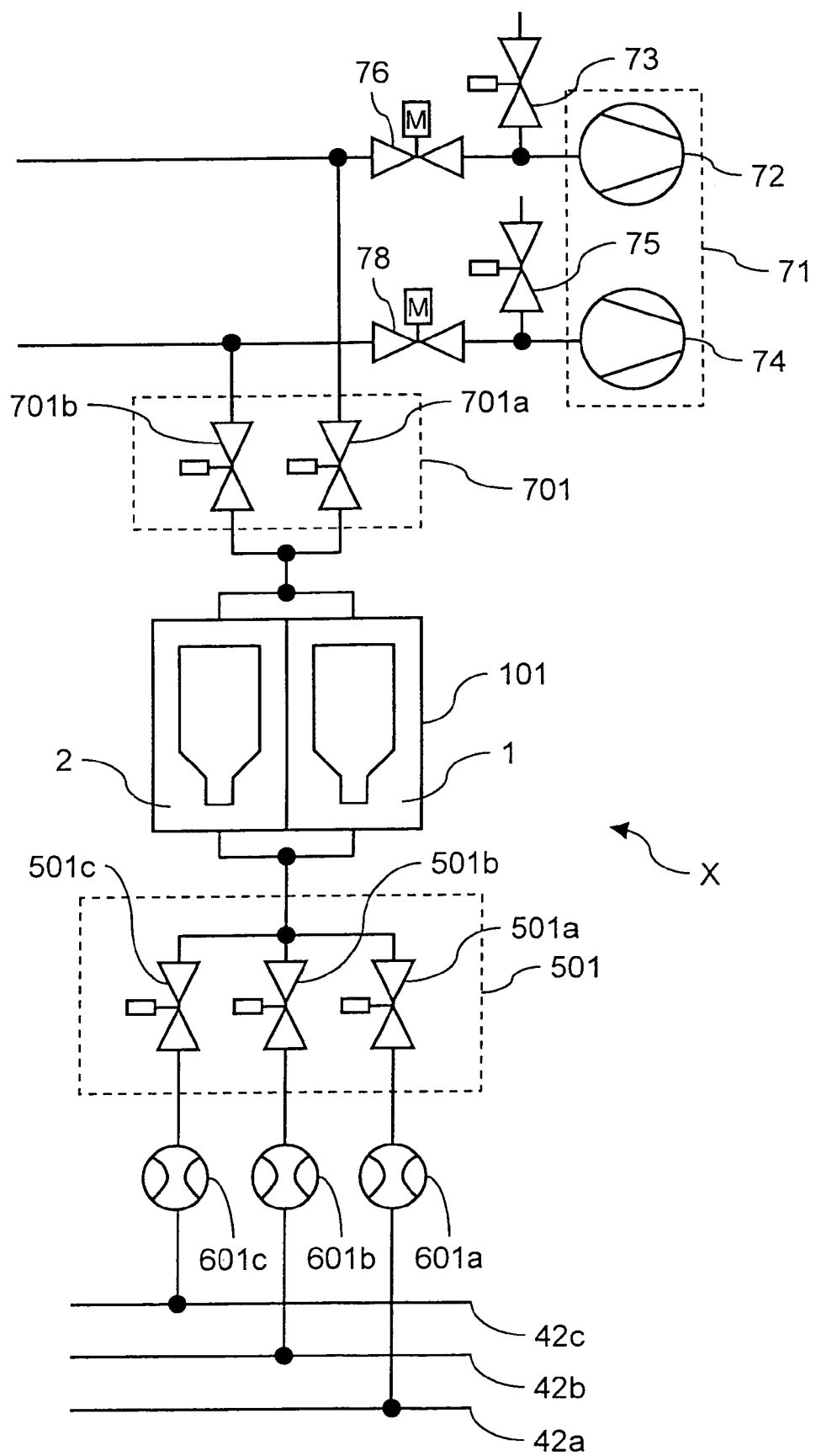
FIG. 4 shows an enlarged excerpt X from FIG. 3.

Referring now to FIG. 4, which shows an excerpt from the fluid control in more detailed form than FIG. 3, the following text provides an explanation of the valve control on the gas routing side on the basis of the example of the first valve group 501. The other valve groups 502 to 512 and the corresponding further components connected upstream and downstream of each valve group are identical in form.

The first valve group 501 comprises three parallel-connected electropneumatic valves 501a, 501b, 501c. The first valve 501a supplies the treatment device 101 with the first process gas, the second valve 501b supplies the treatment device 101 with the second process gas, and the third valve 501c supplies the treatment device 101 with a purge gas SG.

The supply of the operating media or gases (purge gas, first and/or second process gas) can be controlled independently of one another and in a manner which can be selected freely or variably in terms of time.

The valves each have a short switching time of <500 ms, preferably <100 ms. Furthermore, the valves are directly adjacent, at a distance of preferably <50 cm, to the treatment devices. Consequently, coating parameters, such as for example the precursor concentration, the total flow rate, the pressure and/or the process gas or the precursor, can be controlled or changed very quickly. At least 95% of the mixture can be changed in less than 200 ms.

A fixed diaphragm 601a, 601b, 601c is in each case connected upstream of the corresponding valves 501a, 501b, 501c, so that each treatment device is assigned a valve-diaphragm pair for each process gas.

The aperture diameter of the diaphragms is small compared to the line diameter, so that the line resistance in the feed line is negligible and the gas flow is substantially determined by the diaphragms. For this purpose, the aperture diameter is approximately 0.1 mm to 5 mm, preferably 0.2 mm to 2 mm, particularly preferably in the region of 1 mm. As a result, in an equilibrium state a predefined pressure is established on both sides of the diaphragms. This solution using diaphragms is much less expensive than the use of a multiplicity of mass or molecular flow controllers at this location.

The diaphragms distribute the fluids uniformly or symmetrically over all the reactors. By way of example, a total flow rate of 9600 sccm is divided uniformly between 24 reactors, at 400 sccm per reactor.

Furthermore, the diaphragms have a relative deviation of <20%, preferably <10%, so that the process gases are distributed uniformly between the treatment devices.

The gas supply is provided by the fluid or gas supply apparatus 80, which provides the two different process gases via two separate feed lines or operating-medium feed lines 42a, 42b. The two process gases and the purge gas SG are passed continuously onto the rotor 32 via a rotary leadthrough 82.

Figure 5:
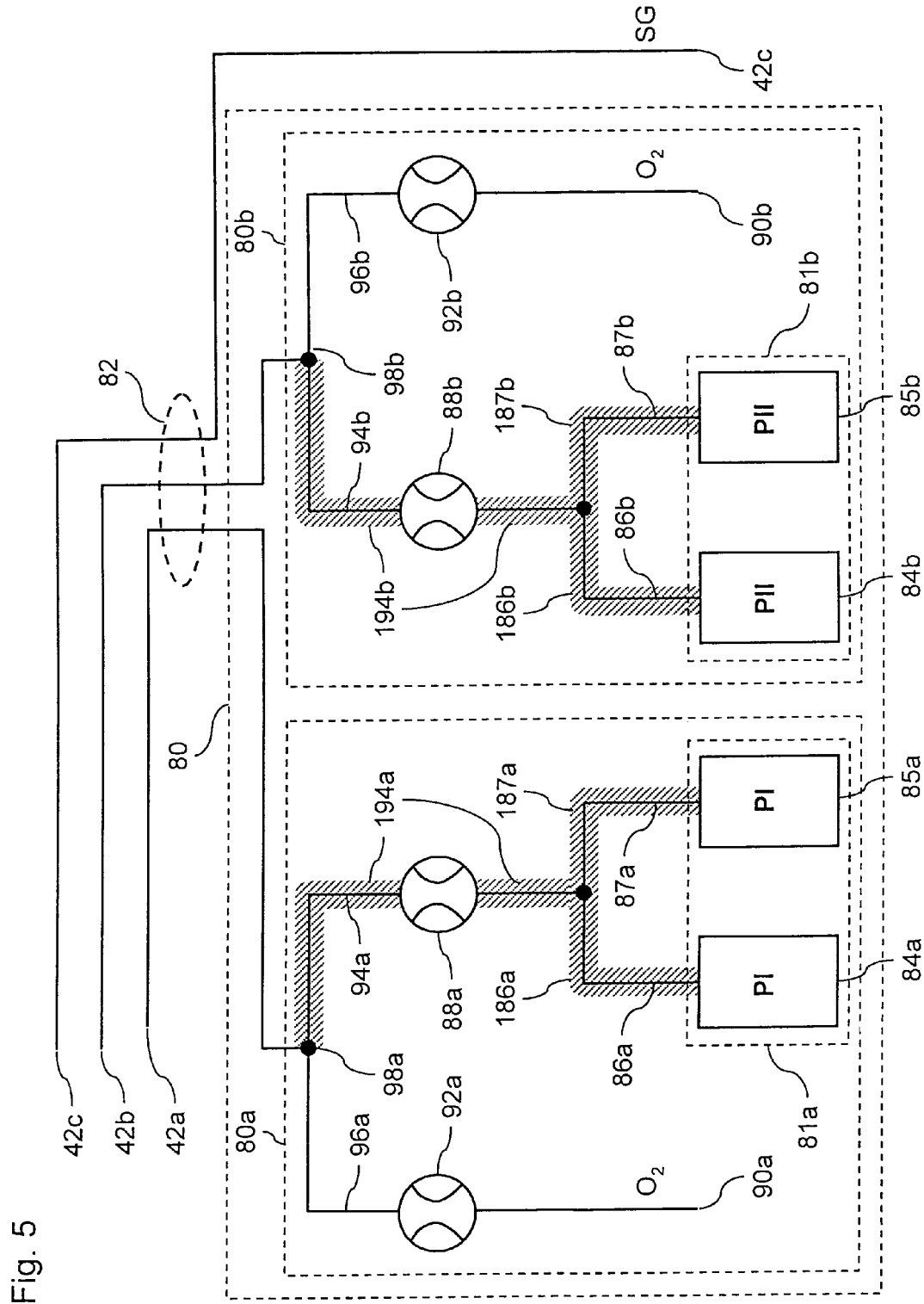
FIG. 5 shows a further enlarged excerpt from FIG. 3 including the fluid supply apparatus 80.

The gas supply apparatus 80, which is illustrated in detail in FIG. 5, comprises a first and a second fluid or gas supply device 80a, 80b, which are identical in structure. The two gas supply devices 80a, 80b differ only in that they provide two different fluid base materials (precursors). The two gas supply devices 80a, 80b therefore provide at least two process gases or gas mixtures with different compositions, flow rates and/or pressures for the at least two successive coating phases BI and BII, which may optionally merge into one another, with the first coating being carried out by means of the first process gas and the second coating being carried out by means of the second process gas. The gas change between the two process gases or gas mixtures may advantageously be switched over quickly, inter alia allowing accurate control of the concentration of the gas mixtures.

The first gas supply device 80a comprises a fluid storage device 81a with two fluid vessels or tanks 84a, 85a, with an identical first precursor, in this example HMDSO, in each of them. The redundant design of the two vessels 84a, 85a makes it possible to change one of the two containers while treatment remains continuously ongoing.

The HMDSO from one of the two vessels 84a, 85a is fed to a first flow-quantity setting means or mass flow controller 88a via a first line section 86a or 87a. The quantitative flow of the first fluid base material is controlled by means of the preferably thermal or pressure-based mass flow controller 88a.

Furthermore, the first gas supply device comprises a feed line 90a, via which gaseous oxygen ($O_2$) is provided. The quantitative flow of the oxygen is controlled by means of a second flow-quantity setting means or mass flow controller 92a. Therefore, only one mass flow controller per process gas component is required.

The mixing ratios, flow rates and/or concentrations of the process gases can be set independently of one another by means of the mass flow controllers 88a, 88b, 92a, 92b.

The first fluid base material and the oxygen are fed to a first mixing device 98a via two line sections 94a and 96a, respectively, and mixed to form the first process gas, which is then provided at the rotary leadthrough 82 via the line 42a and fed to the treatment devices.

The line sections between the two fluid vessels 84a, 85a and the first mixing device 98a are heated to approximately 40° C, in order to evaporate the first fluid base material, which is in liquid form in the two vessels 84a, 85a. After mixing with the oxygen downstream of the first mixing device 98a, the gas mixture or first process gas is gaseous even at room temperature. Therefore, advantageously only a relatively short section of the fluid lines is heated. In particular, there is no need to heat lines on the rotor, since the first process gas is gaseous at room temperature, which simplifies and reduces the costs of the apparatus yet nevertheless avoids condensation.

Referring to FIG. 5, the heated line sections 86a, 87a, 94a, 86b, 87b and 94b are indicated by hatching. In particular, there is in each case one independently controllable heating device 186a and 187a for the line sections 86a and 87a of the redundant fluid vessels 84a and 85a, so that condensation is avoided even when the fluid vessel is being changed. Furthermore, there is an independent heating device 194a for the common line section 94a.

The second gas supply device 80b is in structural terms identical to the first fluid supply device 80a. Corresponding components are provided with the same reference numerals but the index "b" rather than "a". The two vessels 84b, 85b contain HMDSN as the second precursor.

Different mixing ratios are set by the two or if appropriate further fluid storage devices 81a, 81b, preferably by means of the mass flow controllers 88a, 92a, 88b, 92b. By way of example, it is thereby also possible to set different HMDSO concentrations for the same fluid base material, which may be advantageous, for example, for a two-layer system.

On the pump side, the treatment devices 101 to 112 are assigned an evacuation control device having a second valve arrangement 70, by means of which the phased evacuation of the treatment devices 101 to 112 or of the reactors 1 to 24 is controlled. The second valve arrangement 70 comprises in each case one valve group 701 to 712, having in each case a first and a second electrically controlled valve, for each treatment device 101 to 112, for gradual two-stage evacuation by means of a first and second vacuum pump 72, 74.

The vacuum pumps 72, 74 are designed as Roots pumps and are secured to the rotor 32. This advantageously eliminates the is need for a rotary leadthrough on the pump side. The two Roots pumps 72, 74 which form the pump device 71 each have a control valve 76, 78, for example a flapper valve, connected upstream of them. The gas pressure for the corresponding process gas is controlled in open-loop or closed-loop form by means of the flapper valves.

The text which follows provides a more detailed explanation of the valve control of the apparatus on the gas feed side and the pump side with reference to FIGS. 1a to 1h, 2a, 2b and 3.

In the starting phase S, all the valves of the first and second valve arrangements 50, 70 are closed when in each case two PET bottles are being mounted in the treatment devices 101 to 112 and the treatment devices are then being closed.

At the start of the first pumping phase PI, the first valve 701a to 712a of each of the valve groups 701 to 712 is opened, so that each treatment device is connected to the first Roots pump 72 and evacuated.

At the transition from the first pumping phase PI to the second pumping phase PII, in each case the first valve 701a to 712a of the valve groups 701 to 712 closes, and substantially at the same time the second valve 701b to 712b of the valve groups 701 to 712 opens, in order to connect the treatment devices 101 to 112 to the second Roots pump 74, so that the treatment devices in the second pumping phase PII are evacuated.

A gas ballast valve 73 and 75 (illustrated only in FIG. 4) is in each case connected upstream of the Roots pumps 72, 74, respectively, by means of which gas ballast valve the process gas concentration in the off-gas can be reduced. This is advantageous in particular for explosive gas mixtures, since in particular unused process gas can be diluted, thereby reliably keeping it below the explosion limit.

At the start of the first coating phase BI, the valves 501a to 512a of the first valve arrangement 50 are opened, so that the first process gas comprising HMDSO and $O_2$ flows into the treatment devices 101 to 112 and the PET bottles are correspondingly PICVD-coated with an organic bonding layer.

At the change from the first coating phase BI to the second coating phase BII, the valves 501a to 512a close, and substantially at the same time the valves 501b to 512b open, in order to supply the treatment devices with the second process gas comprising HMDSN and $O_2$, with the PET bottles being PICVD-coated with an inorganic barrier layer.

It is particularly preferable for at least two of the valve groups 501 to 512 to be switched synchronously, with the associated treatment devices changing from one process phase to another, in such a manner that one treatment device changes to the previous process phase of another treatment device. By way of example, the treatment device 101 comprising the stations 1 and 2 changes from the second coating phase BII to the vent phase V, and synchronously, i.e. simultaneously, the treatment device 109 comprising the stations 17 and 18 changes to the second coating phase BII.

During the first and second coating phases BI and BII, the treatment devices preferably remain connected to the second Roots pump 74 in order to allow the PICVD coating to be carried out in through-flow mode.

In the subsequent vent phase V, all the valves of the valve arrangements 50, 70 are closed and the treatment devices 101 to 112 are vented, if appropriate with nitrogen or dried air.

It will be clear to the person skilled in the art that the embodiments described above are to be understood as examples and that the invention is not restricted to these particular embodiments, but rather can be varied in numerous ways without departing from the spirit of the invention.

The invention claimed is:

1. An apparatus for the treatment of workpieces, comprising:
    at least one treatment device for receiving at least one workpiece;
    a fluid supply apparatus that supplies the at least one treatment device with a fluid;
    at least one fluid control device that can be used to control the fluid supply apparatus;
    a rotary installation having a moveable portion, the moveable portion comprising a rotor; and
    a pump device with at least one pump arranged on the rotor for rotating therewith, for evacuating the at least one treatment device, the at least one treatment device being configured to coat the at least one workpiece by a CVD process.

2. The apparatus as claimed in claim 1, wherein the at least one fluid control device comprises a first valve arrangement.

3. The apparatus as claimed in claim 1, wherein the at least one treatment device comprises a plurality of treatment devices and the fluid control device comprises a plurality of valve groups, wherein each treatment device of the plurality of treatment devices is assigned a valve group from the plurality of valve groups.

4. The apparatus as claimed in claim 3, wherein each valve group of the plurality of valve groups can be variably set in a predetermined state by a formula for an assigned a process phase.

5. The apparatus as claimed in claim 3, wherein each treatment device of the plurality of treatment devices is assigned at least one diaphragm, the predetermined opening of each at least one diaphragm being of equal size.

6. The apparatus as claimed in claim 3, wherein the fluid supply apparatus makes available a plurality of fluids and each valve group of the plurality of valve groups has a valve for each fluid of the plurality of fluids.

7. The apparatus as claimed in claim 3, further comprising a treatment cycle with a plurality of process phases, the treatment cycle being passed through by each treatment device of the plurality of treatment devices in a time-offset manner.

8. The apparatus as claimed in claim 3, further comprising a treatment cycle with a plurality of process phases, each treatment device of the plurality of treatment devices passing through the treatment cycle.

9. The apparatus as claimed in claim 3, further comprising a once-through installation that defines a treatment cycle with a plurality of process phases, a static portion, and a moveable portion, the plurality of treatment devices being arranged at the moveable portion, and each of the plurality of treatment devices adopting a plurality of positions during the treatment cycle where each of the plurality of positions are assigned a plurality of predetermined process phases that can be set variably for each of the plurality of process phases by a formula.

10. The apparatus as claimed in claim 9, wherein the formula can differently assign each of the plurality of predetermined process phases to each of the plurality of positions, and wherein the formula can differently set a plurality of durations for each of the plurality of process phases.

11. The apparatus as claimed in claim 3, further comprising a rotatable sealing connection connecting the fluid supply apparatus to the plurality of treatment devices, wherein the rotatable sealing connection feeds the fluid to the plurality of treatment devices.

12. The apparatus as claimed in claim 11, wherein the rotatable sealing connection has an outlet for the continuous removal of the fluid.

13. The apparatus as claimed in claim 11, further comprising a flow-quantity setting device arranged downstream of the fluid supply apparatus for directing a flow of the fluid to a mixing device arranged downstream of the flow-quantity setting device for mixing the fluid with a second fluid, and wherein the rotatable sealing connection is arranged downstream of the mixing device.

14. The apparatus as claimed in claim 13, further comprising a fluid distributor device arranged downstream of the rotatable sealing connection.

15. The apparatus as claimed in claim 14, further comprising a plurality of diaphragms arranged downstream of the fluid distributor device.

16. The apparatus as claimed in claim 15, wherein each valve group of the plurality of valve groups is arranged downstream of an associated diaphragm of the plurality of diaphragms.

17. The apparatus as claimed in claim 1, wherein the at least one fluid control device can be controlled by a plurality of control signals.

18. The apparatus as claimed in claim 1, wherein the at least one treatment device coats the at least one workpiece with a first coating during a first process phase, and coats the at least one workpiece with a second coating during a second process phase.

19. The apparatus as claimed in claim 1, further comprising at least one control valve for setting and controlling a process pressure.

20. The apparatus as claimed in claim 1, further comprising
    a fluid distributor device for distributing the fluid to the at least one treatment device; and
    a flow-quantity setting device arranged upstream of the fluid distributor device.

21. The apparatus as claimed in claim 1, wherein the at least one treatment device comprises at least two treatment stations wherein the at least two treatment stations are parallel and symmetrical in structure to one another, and wherein the at least two treatment stations connect simultaneously to a plurality of process stages.

22. The apparatus as claimed in claim 1, wherein the rotor has a plurality of angled regions for variably assigning a predetermined process phase by a formula.

23. The apparatus as claimed in claim 1, wherein at least a portion of the at least one fluid control device is arranged at the rotor and rotates with the rotor.

24. The apparatus as claimed in claim 1, wherein the rotor has an angular position that can be synchronously controlled with the plurality of valve groups.

25. The apparatus as claimed in claim 1, further comprising a plurality of valves for controlling the pump device for the cyclic evacuation of the plurality of treatment devices.

26. The apparatus as claimed in claim 1, wherein the fluid supply apparatus comprises at least two fluid storage devices, each of the at least two fluid storage devices containing a fluid base material.

27. The apparatus as claimed in claim 26, further comprising a mass flow controller that can set different mixing ratios for the fluid base material.

28. The apparatus as claimed in claim 26, wherein the fluid base material is identical or different in each fluid storage device of the at least two fluid storage devices.

29. The apparatus as claimed in claim 1, further comprising a flow-quantity setting device for directing a flow of the fluid, the flow-quantity setting device being arranged downstream of the fluid supply apparatus.

30. The apparatus as claimed in claim 29, further comprising a mixing device arranged downstream of the flow-quantity setting device for mixing the fluid with a second fluid.

31. An apparatus for treating workpieces, comprising:
a rotary installation having a moveable portion, the moveable portion comprising a rotor;
    a pump device with at least one pump arranged on the rotor for rotation therewith and for evacuation of at least one workpiece;
    at least one CVD treatment device for receiving the at least one workpiece; and
    a fluid supply device that supplies the at least one treatment device with at least a first material and a second material, and
    wherein the at least one treatment device coats the at least one workpiece by a CVD process with the first material in a first coating phase and the second material in a second coating phase.

\* \* \* \* \*